United States Patent
Coan et al.

(10) Patent No.: US 8,964,821 B2
(45) Date of Patent: Feb. 24, 2015

(54) SHARED FEEDBACK FOR ADAPTIVE TRANSMITTER PRE-DISTORTION

(75) Inventors: Philip D. Coan, La Jolla, CA (US); Paul J. Draxler, San Diego, CA (US); Roberto Rimini, San Diego, CA (US); Thomas D. Marra, San Diego, CA (US); Gurkanwal Singh Sahota, San Diego, CA (US); Steven C. Ciccarelli, San Diego, CA (US); Shrenik Patel, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 320 days.

(21) Appl. No.: 13/364,065

(22) Filed: Feb. 1, 2012

(65) Prior Publication Data

US 2013/0094550 A1    Apr. 18, 2013

Related U.S. Application Data

(60) Provisional application No. 61/547,640, filed on Oct. 14, 2011.

(51) Int. Cl.
*H04B 1/38* (2006.01)
*H04L 5/16* (2006.01)
(Continued)

(52) U.S. Cl.
CPC .......... *H04L 27/368* (2013.01); *H03F 1/3247* (2013.01); *H03F 3/195* (2013.01); *H03F 3/245* (2013.01); *H03F 3/68* (2013.01); *H03F 3/72* (2013.01); *H03F 2201/3212* (2013.01); *H03F 2203/7221* (2013.01); *H03F 2203/7236* (2013.01); *H04B 7/0825* (2013.01)
USPC ........... 375/222; 375/219; 375/295; 375/297; 375/316; 455/522

(58) Field of Classification Search
CPC ............ H04M 11/06; H04B 1/40; H04B 3/23
USPC .................. 375/222, 296, 297, 219, 295, 316; 455/522; 340/538
See application file for complete search history.

(56) References Cited

U.S. PATENT DOCUMENTS 6,029,285 A    2/2000  Belcher et al.
6,141,390 A   10/2000  Cova
(Continued)

FOREIGN PATENT DOCUMENTS

CN      101272155 A    9/2008
EP       1011192 A2    6/2000
(Continued)

OTHER PUBLICATIONS

International Search Report and Written Opinion—PCT/US2012/060306—ISA/EPO—Jan. 25, 2013.

*Primary Examiner* — Ted Wang
(74) *Attorney, Agent, or Firm* — James Gutierrez

(57) ABSTRACT

A modem is described. The modem includes a transmitter. The transmitter includes a digital pre-distortion module and a power amplifier. The modem also includes one or more selected shared receivers. The one or more selected shared receivers generate a feedback signal for the digital pre-distortion module. The modem further includes a feedback switch. The feedback switch selectively couples the one or more selected shared receivers to an output of the transmitter.

43 Claims, 8 Drawing Sheets

(51) Int. Cl.
*H04L 27/36* (2006.01)
*H03F 1/32* (2006.01)
*H03F 3/195* (2006.01)
*H03F 3/24* (2006.01)
*H03F 3/68* (2006.01)
*H03F 3/72* (2006.01)
*H04B 7/08* (2006.01)

(56) References Cited

U.S. PATENT DOCUMENTS

| | | | |
|---|---|---|---|
| 6,211,733 | B1 | 4/2001 | Gentzler |
| 6,275,685 | B1 | 8/2001 | Wessel et al. |
| 6,885,242 | B2 | 4/2005 | Leffel et al. |
| 7,109,792 | B2 | 9/2006 | Leffel |
| 7,479,828 | B2 | 1/2009 | Benedict |
| 7,529,524 | B1 | 5/2009 | Giallorenzi et al. |
| 8,055,217 | B2 | 11/2011 | Ba et al. |
| 8,229,025 | B1 | 7/2012 | Summerfield |
| 8,384,476 | B2 | 2/2013 | Draxler et al. |
| 8,737,526 | B2 | 5/2014 | Coan et al. |
| 2002/0171485 | A1 | 11/2002 | Cova |
| 2003/0058959 | A1* | 3/2003 | Rafie et al. ............... 375/296 |
| 2003/0132802 | A1 | 7/2003 | Ring et al. |
| 2004/0001559 | A1 | 1/2004 | Pinckley et al. |
| 2004/0105509 | A1 | 6/2004 | McGowan et al. |
| 2004/0203540 | A1 | 10/2004 | Anvari et al. |
| 2007/0004358 | A1 | 1/2007 | Moorti |
| 2008/0159435 | A1 | 7/2008 | Cohen |
| 2008/0218262 | A1 | 9/2008 | Ziegler et al. |
| 2009/0184763 | A1 | 7/2009 | Kim |
| 2009/0207896 | A1 | 8/2009 | Behzad |
| 2010/0093290 | A1 | 4/2010 | Van Zelm et al. |
| 2010/0271123 | A1 | 10/2010 | Forrester et al. |
| 2010/0323641 | A1 | 12/2010 | Aparin et al. |
| 2011/0143791 | A1 | 6/2011 | Pan et al. |
| 2011/0280324 | A1* | 11/2011 | Mielczarek et al. ........ 375/259 |
| 2012/0002752 | A1* | 1/2012 | Coan et al. ................. 375/297 |

FOREIGN PATENT DOCUMENTS

| | | |
|---|---|---|
| EP | 1065856 A2 | 1/2001 |
| EP | 1193862 | 4/2002 |
| EP | 1612933 A1 | 1/2006 |
| JP | S62153769 A | 7/1987 |
| JP | H06205064 A | 7/1994 |
| JP | H08125565 A | 5/1996 |
| JP | 2000216640 A | 8/2000 |
| JP | 2004312344 A | 11/2004 |
| JP | 2009516412 A | 4/2009 |
| TW | 200913598 A | 3/2009 |
| WO | WO2004105231 | 12/2004 |
| WO | 2007054895 A1 | 5/2007 |
| WO | 2010019601 A1 | 2/2010 |

* cited by examiner

SHARED FEEDBACK FOR ADAPTIVE TRANSMITTER PRE-DISTORTION

CLAIM OF PRIORITY UNDER 35 U.S.C. §119

The present Application for Patent claims priority to Provisional Application No. 61/547,640 entitled "SHARED FEEDBACK FOR ADAPTIVE TRANSMITTER PRE-DISTORTION" filed Oct. 14, 2011, and assigned to the assignee hereof and hereby expressly incorporated by reference herein.

TECHNICAL FIELD

The present disclosure relates generally to electronic devices for communication systems. More specifically, the present disclosure relates to systems and methods for shared feedback for adaptive transmitter predistortion.

BACKGROUND

Wireless communication systems are widely deployed to provide various types of communication content such as voice, video, data, and so on. These systems may be multiple-access systems capable of supporting simultaneous communication of multiple terminals with one or more base stations.

It is desirable that these terminals send and receive large amounts of data within a given bandwidth. It is also desirable that these terminals conserve battery power. Typically, sending and receiving large amounts of data may reduce the battery lifetime of a terminal. One way to increase the battery time of a terminal is to use more efficient amplifiers within the terminal. However, these efficient amplifiers may introduce additional distortion to transmit signals and cause significant spectral re-growth distortion.

One solution is to operate these amplifiers near the non-linear region and use a pre-distortion device at the input of the amplifier to counteract the distortion introduced to transmit signals by the amplifier. However, these pre-distortion devices may need a model of the non-linear characteristics of the amplifier to properly adjust the pre-distortion applied. To maintain a model of the non-linear characteristics of the amplifier, feedback may be needed. Such feedback has typically required a dedicated receiver, which may increase both the cost and the chip real estate of the terminal prohibitively. Thus, there is a need for adaptive pre-distortion without the additional hardware of a dedicated receiver.

SUMMARY

A modem is described. The modem includes a transmitter. The transmitter includes a digital pre-distortion module and a power amplifier. The modem also includes one or more selected shared receivers that generate a feedback signal for the digital pre-distortion module. The modem further includes a feedback switch selectively coupling the one or more selected shared receivers to an output of the transmitter.

The feedback switch may be coupled to an output of the power amplifier. The feedback switch may selectively couple the output of the transmitter to an input of a mixer in the one or more selected shared receivers. The modem may include an attenuation coupling between an output of the power amplifier and the feedback switch. The feedback signal may be a receiver baseband signal output by the one or more selected shared receivers. The one or more selected shared receivers may include a voltage controlled oscillator tuned to a receiving frequency of the one or more selected shared receivers when the feedback switch is open and tuned to a transmit frequency of the transmitter when the feedback switch is closed. The one or more selected shared receivers may instead include a voltage controlled oscillator tuned to a frequency used by both the one or more selected shared receivers and the transmitter.

The feedback switch may be closed during a time when a downlink throughput of shutting the one or more selected shared receivers out is minimal. The digital pre-distortion module may add digital pre-distortion to a transmit signal. The digital pre-distortion may be adjusted according to a feedback signal received from the one or more selected shared receivers when the feedback switch is closed.

The modem may also include a receiver selection switch. The modem may further include multiple receivers. The receiver selection switch may select a subset of the multiple receivers as the one or more selected shared receivers. The subset of the multiple receivers may include the receivers that provide the best feedback signal to the transmitter. The modem may be part of a wireless communication device, a picocell or a femtocell. The one or more selected shared receivers may be a diversity receiver.

A method for applying digital pre-distortion in a transmitter is also described. Digital pre-distortion is applied to a baseband transmit signal to obtain a pre-distorted signal. The pre-distorted signal is amplified using a power amplifier to obtain a transmit signal. The transmit signal is passed through one or more shared receivers to obtain a feedback signal. The digital pre-distortion applied to the baseband transmit signal is adjusted according to the feedback signal.

The digital pre-distortion may be applied using an adaptive digital pre-distortion module. The feedback signal may be provided to the adaptive digital pre-distortion module. The feedback signal may be an output of a baseband filter on the one or more shared receivers. The transmit signal may be input to a mixer in the one or more shared receivers.

A feedback switch may be adjusted to provide the transmit signal to the mixer in the one or more shared receivers. The feedback switch may also be adjusted to discontinue providing the transmit signal to the mixer in the one or more shared receivers. The digital pre-distortion applied to the baseband transmit signal may only be adjusted when the feedback switch is closed and providing the transmit signal to the mixer in the one or more shared receivers.

A frequency of a voltage controlled oscillator in the one or more shared receivers may be tuned to a transmit frequency prior to adjusting the digital pre-distortion applied to the baseband transmit signal. The frequency of the voltage controlled oscillator in the one or more shared receivers may be tuned to a diversity receive frequency after adjusting the digital pre-distortion applied to the baseband transmit signal.

One or more shared receivers may be selected from a subset of receivers as selected shared receivers. A receiver selection switch may be adjusted to provide the transmit signal the one or more selected shared receivers. The method may be performed by a modem.

An apparatus is also described. The apparatus includes means for applying digital pre-distortion to a baseband transmit signal to obtain a pre-distorted signal. The apparatus also includes means for amplifying the pre-distorted signal using a power amplifier to obtain a transmit signal. The apparatus further includes means for passing the transmit signal through one or more shared receivers to obtain a feedback signal. The apparatus also includes means for adjusting the digital pre-distortion applied to the baseband transmit signal according to the feedback signal.

A computer-program product for adjusting digital pre-distortion is described. The computer-program product includes a non-transitory computer-readable medium having instructions thereon. The instructions include code for causing a wireless device to apply digital pre-distortion to a baseband transmit signal to obtain a pre-distorted signal. The instructions also include code for causing the wireless device amplify the pre-distorted signal using a power amplifier to obtain a transmit signal. The instructions further include code for causing the wireless device to pass the transmit signal through one or more shared receivers to obtain a feedback signal. The instructions also include code for causing the wireless device to adjust the digital pre-distortion applied to the baseband transmit signal according to the feedback signal.

DETAILED DESCRIPTION

The $3^{rd}$ Generation Partnership Project (3GPP) is a collaboration between groups of telecommunications associations that aims to define a globally applicable $3^{rd}$ generation (3G) mobile phone specification. 3GPP Long Term Evolution (LTE) is a 3GPP project aimed at improving the Universal Mobile Telecommunications System (UMTS) mobile phone standard. The 3GPP may define specifications for the next generation of mobile networks, mobile systems and mobile devices. In 3GPP LTE, a mobile station or device may be referred to as a "user equipment" (UE).

3GPP specifications are based on evolved Global System for Mobile Communications (GSM) specifications, which are generally known as the Universal Mobile Telecommunications System (UMTS). 3GPP standards are structured as releases. Discussion of 3GPP thus frequently refers to the functionality in one release or another. For example, Release 99 specifies the first UMTS third generation (3G) networks, incorporating a CDMA air interface. Release 6 integrates operation with wireless local area networks (LAN) networks and adds High Speed Uplink Packet Access (HSUPA). Release 8 introduces dual downlink carriers and Release 9 extends dual carrier operation to uplink for UMTS.

CDMA2000 is a family of third generation (3G) technology standards that use code division multiple access (CDMA) to send voice, data and signaling between wireless devices. CDMA2000 may include CDMA2000 1X, CDMA2000 EV-DO Rev. 0, CDMA2000 EV-DO Rev. A and CDMA2000 EV-DO Rev. B. 1x or 1xRTT refers to the core CDMA2000 wireless air interface standard. 1x more specifically refers to 1 times Radio Transmission Technology and indicates the same radio frequency (RF) bandwidth as that used in IS-95. 1xRTT adds 64 additional traffic channels to the forward link. EV-DO refers to Evolution-Data Optimized. EV-DO is a telecommunications standard for the wireless transmission of data through radio signals.

Figure 1:
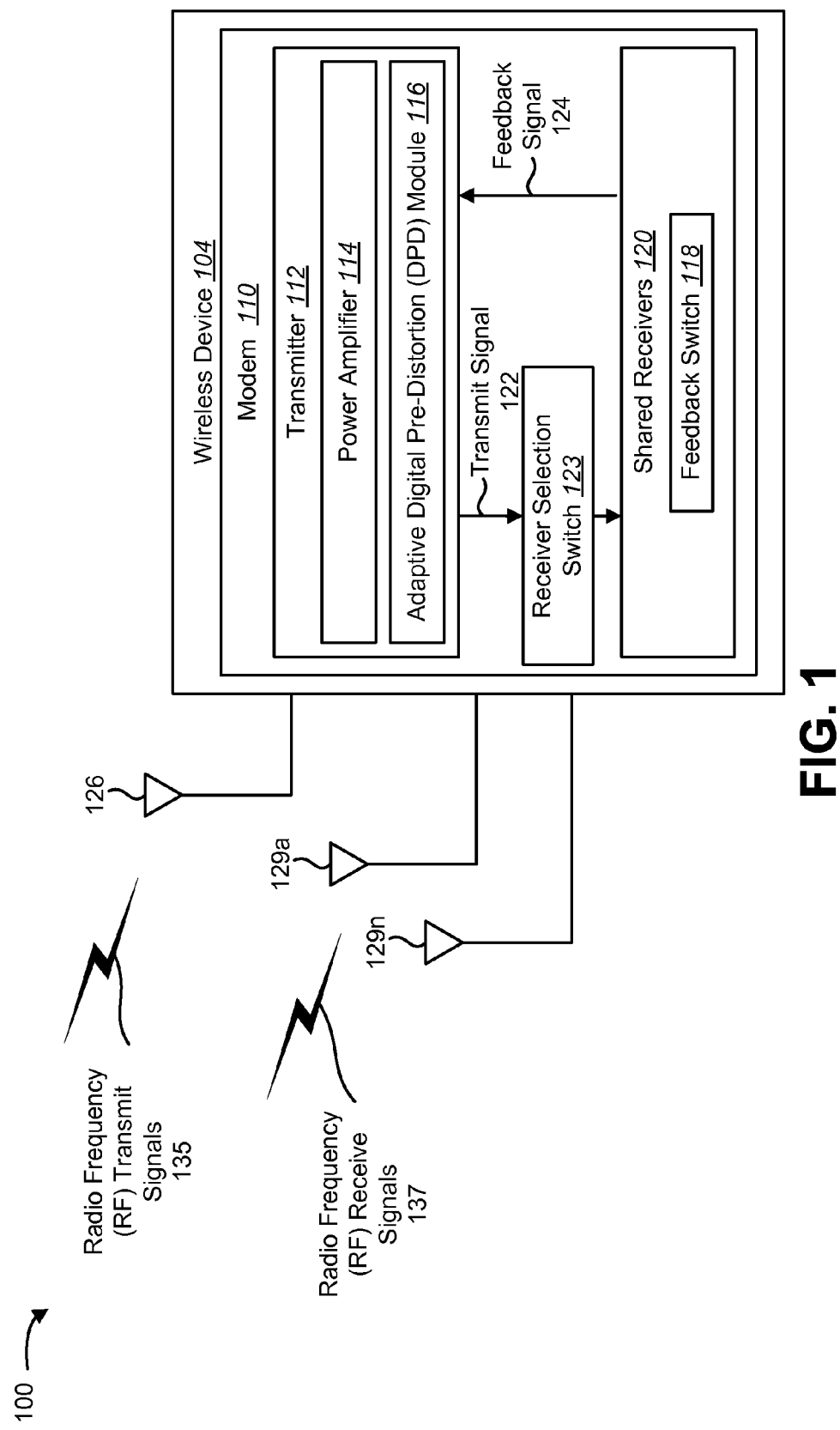
FIG. 1 shows a wireless communication system with multiple wireless devices.

FIG. 1 shows a wireless communication system 100 with a wireless device 104. A wireless device 104 may be a base station, a wireless communication device, a controller, or the like. A base station is a station that communicates with one or more wireless communication devices. A base station may also be referred to as, and may include some or all of the functionality of, an access point, a broadcast transmitter, a Node B, an evolved Node B, etc. Each base station provides communication coverage for a particular geographic area. A base station may provide communication coverage for one or more wireless communication devices. The term "cell" can refer to a base station and/or its coverage area depending on the context in which the term is used. Each cell may be further divided into sectors. A base station may thus cover multiple sectors.

A wireless communication device may also be referred to as, and may include some or all of the functionality of, a terminal, an access terminal, a user equipment (UE), a subscriber unit, a station, etc. A wireless communication device may be a cellular phone, a personal digital assistant (PDA), a wireless device, a wireless modem, a handheld device, a laptop computer, a PC card, compact flash, an external or internal modem, a wireline phone, etc. A wireless communication device may be mobile or stationary. A wireless communication device may communicate with zero, one or multiple base stations on a downlink and/or an uplink at any given moment. The downlink (or forward link) refers to the communication link from a base station to a wireless communication device, and the uplink (or reverse link) refers to the communication link from a wireless communication device to a base station. Uplink and downlink may refer to the communication link or to the carriers used for the communication link.

Communications in a wireless system (e.g., a multiple-access system) may be achieved through transmissions over a wireless link. Such a communication link may be established via a single-input and single-output (SISO), multiple-input and single-output (MISO) or a multiple-input and multiple-output (MIMO) system. A MIMO system includes transmitter(s) and receiver(s) equipped, respectively, with multiple (NT) transmit antennas and multiple (NR) receive antennas for data transmission. SISO and MISO systems are particular instances of a MIMO system. The MIMO system can provide improved performance (e.g., higher throughput, greater capacity or improved reliability) if the additional dimensionalities created by the multiple transmit and receive antennas are utilized.

The wireless communication system 100 may utilize MIMO. A MIMO system may support both time division duplex (TDD) and frequency division duplex (FDD) systems. In a TDD system, uplink and downlink transmissions are on the same frequency region so that the reciprocity principle allows the estimation of the downlink channel from the uplink channel. This enables a transmitting wireless device 104 to extract transmit beamforming gain from communications received by the transmitting wireless device 104.

The wireless communication system 100 may be a multiple-access system capable of supporting communication with multiple wireless communication devices by sharing the available system resources (e.g., bandwidth and transmit power). Examples of such multiple-access systems include code division multiple access (CDMA) systems, wideband code division multiple access (W-CDMA) systems, time division multiple access (TDMA) systems, frequency division multiple access (FDMA) systems, orthogonal frequency division multiple access (OFDMA) systems, single-carrier frequency division multiple access (SC-FDMA) systems, $3^{rd}$ Generation Partnership Project (3GPP) Long Term Evolution (LTE) systems and spatial division multiple access (SDMA) systems.

The terms "networks" and "systems" are often used interchangeably. A CDMA network may implement a radio technology such as Universal Terrestrial Radio Access (UTRA), cdma2000, etc. UTRA includes W-CDMA and Low Chip Rate (LCR) while cdma2000 covers IS-2000, IS-95 and IS-856 standards. A TDMA network may implement a radio technology such as Global System for Mobile Communications (GSM). An OFDMA network may implement a radio technology such as Evolved UTRA (E-UTRA), IEEE 802.11, IEEE 802.16, IEEE 802.20, Flash-OFDMA, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS and LTE are described in documents from an organization named "3rd Generation Partnership Project" (3GPP). cdma2000 is described in documents from an organization named "3rd Generation Partnership Project 2" (3GPP2).

The systems and methods herein may be used for wireless devices 104 that operate using time division duplex (TDD) and/or frequency division duplex (FDD). In cases where the wireless device 104 operates using time division duplex (TDD), the wireless device 104 may have only one receiver or it may have more than one receiver. Also, for time division duplex (TDD), the feedback switch 118 might not be needed, since the receiver(s) used as shared receiver 120 may receive enough signal leaking to provide an accurate feedback signal 124 to the transmitter 112.

A wireless device 104 may generate radio frequency (RF) transmit signals 135 using an antenna 126. The wireless device 104 may also receive radio frequency (RF) receive signals 137 using one or more antennas 129a-n. The transmit antenna 126 and the receiving antennas 129 may be the same antenna or different antennas.

In wireless communications, there is a general need for wireless devices 104 that are capable of transmitting more data within a given bandwidth while achieving optimal power efficiency to conserve battery power. For instance, wireless devices 104 have been designed using different modulation schemes, such as quadrature amplitude modulation (QAM) having 16, 32 or 64 constellations, to increase the data throughput within a given bandwidth. Additionally, wireless devices 104 have been designed using power amplifiers 114 that operate close to their saturation region, such as class A/B, B, C and other class amplifiers, to improve the power consumption efficiency.

Because of the relatively high spectral efficiency of the data transmission, such wireless devices 104 often have tight requirements on the allowable spectral leakage. In some cases, these requirements present a problem for operating power amplifiers 114 close to their saturation regions because the nonlinearity characteristic of the power amplifier 114 causes significant spectral re-growth and in-band distortion. One solution is to backoff the operation of the power amplifier 114 into its linear region so as to reduce or prevent this distortion. However, this results in reduced power efficiency for the wireless device 104, which may have an adverse impact on the battery life and continued use of the wireless device 104.

Another solution is to operate the power amplifier 114 near its saturation or nonlinear region, and use a digital pre-distortion (DPD) module 116 prior to the power amplifier 114 to distort the input signal of the power amplifier 114 to correct or reduce the distortion of the output signal caused by the nonlinearity of the power amplifier 114. Digital pre-distortion (DPD) may improve the linearity, reduce the out-of-band (OOB) emissions and improve the efficiency of a radio frequency (RF) transmitter 112. There are generally two approaches: an open loop approach and a closed loop approach. The open loop approach typically works well as long as the nonlinear characteristic of the power amplifier 114 is accurately modeled and does not significantly change over time with environmental conditions. The closed loop approach involves providing adaptation to the digital pre-distortion (DPD) module 116 to allow the digital pre-distortion (DPD) module 116 to model the nonlinear characteristic of the power amplifier 114 in "real time," and adjust the predistortion of the input signal in accordance with the present model of the power amplifier 114.

Adaptive digital pre-distortion (DPD) may be complicated and expensive. For instance, adaptive digital pre-distortion (DPD) may require an accurate model of the transmitter 112 and feedback to adjust the model during operation. The feedback often requires additional hardware. Adding this additional hardware may increase the cost of the wireless device 104. One solution is to reuse the equipment located on a modem 110 on the wireless device 104. The modem 110 may already include one or more receivers that may be used as shared receivers 120. By selectively coupling the one or more shared receivers 120 to an output of a transmitter 112 on the modem 110 via a receiver selection switch 123 and a feedback switch 118, the shared receivers 120 may be used to provide a feedback signal 124 to a digital pre-distortion (DPD) module 116 on the transmitter 112 without adding additional hardware, such as a dedicated receiver, to the wireless device 104. The shared receivers 120 may receive a transmit signal 122 from the transmitter 112.

Heat has been identified as a significant problem in phones and especially densely packed smartphones. The use of power efficient Envelope Tracking transmitters 112 may be used when the transmitters 112 include adaptive digital pre-distortion (DPD) modules 116. Envelope Tracking transmitters 112 have been discussed in detail in U.S. Pat. No. 2,666,133 to Leonard R. Kahn.

Figure 2:
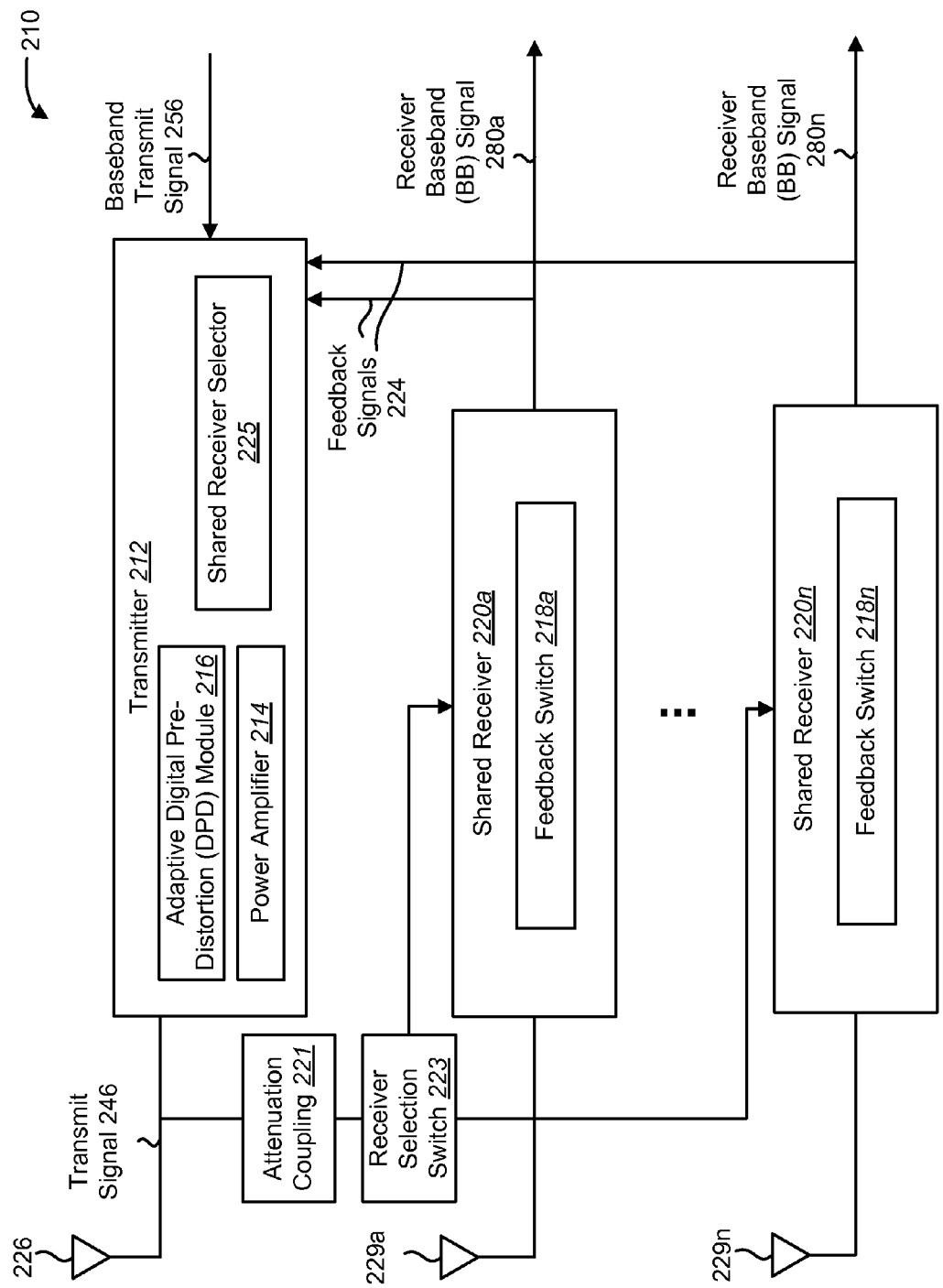
FIG. 2 is a block diagram illustrating a modem for use in the present systems and methods.

FIG. 2 is a block diagram illustrating a modem 210 for use in the present systems and methods. The modem 210 of FIG. 2 may be one configuration of the modem 110 of FIG. 1. The modem 210 may include a transmitter 212 and multiple shared receivers 220a-n. Each of the shared receivers 220 may be coupled to a receiving antenna 229a-n. Alternatively, each of the shared receivers 220 may be coupled to the same antenna 229. In one configuration, only some of the shared receivers 220 may share an antenna 229. A shared receiver 220 is a receiver that can be used for the dual purposes of receiving signals and providing feedback to the transmitter 212. As an example, a shared receiver 220 may be a primary receiver or a diversity receiver (DRx). The modem 210 may select one or more of the receivers on the wireless device 104 to be a shared receiver 220.

The transmitter 212 may be coupled to an antenna 226. The transmitter 212 may include a power amplifier 214. For modems 210 used in wireless devices 104 where power consumption and/or hardware space needs is limited such as a wireless communication device, a femtocell, a picocell, a repeater or a relay, the power amplifier 214 may operate near the saturation region. However, such operation may result in significant distortion added to the transmit signal 246. To compensate for this distortion, the transmitter 212 may include an adaptive digital pre-distortion (DPD) module 216. The adaptive digital pre-distortion (DPD) module 216 may be used to provide amplitude-to-amplitude modulation (AMAM) compensation and amplitude-to-phase modulation (AMPM) compensation to a baseband transmit signal 256 received by the transmitter 212. This compensation may allow the power amplifier 214 to operate close to the saturation region without adding significant distortion to the transmit signal 246.

The adaptive digital pre-distortion (DPD) module 216 may require a feedback signal 224 from a shared receiver 220 to operate properly. In one configuration, the adaptive digital pre-distortion (DPD) module 216 may receive feedback signals 224 from multiple shared receivers 220. The transmitter 212 may include a shared receiver selector 225. The shared receiver selector 225 may be used by the transmitter 212 to select one or more receivers to be used as the shared receiver 220. For example, the shared receiver selector 225 may select the shared receivers 220 that will provide the best feedback signal 224.

The shared receiver selector 225 may control a receiver selection switch 223. The receiver selection switch 223 may select one or more shared receivers 220 to receive a transmit signal 246 from the transmitter 212. The transmit signal 246 may first be passed through an attenuation coupling 221 to reduce the magnitude of the transmit signal 246 to a level useable by the shared receivers 220. Each of the shared receivers 220 may include a feedback switch 218a-n. The feedback switch 218 may switch the input of the shared receiver 220 from the antenna 229 to the transmit signal 246. Thus, if the feedback switch 218 is off, the shared receiver 220 may not receive the transmit signal 246 and not provide feedback signals 224 to the transmitter 212. Each shared receiver 220 may output a receiver baseband (BB) signal 280a-n. When the feedback switch 218 is on, the receiver baseband (BB) signal 280 may provide feedback data (i.e., feedback signals 224) to the transmitter 212. This feedback data may be used by the adaptive digital pre-distortion (DPD) module 216 to adjust the digital pre-distortion applied to the transmit signal 246, compensating for the distortion added by the power amplifier 214. Feedback signals 224 may be a burst or packet of data provided to the adaptive digital pre-distortion (DPD) module 216.

Figure 3:
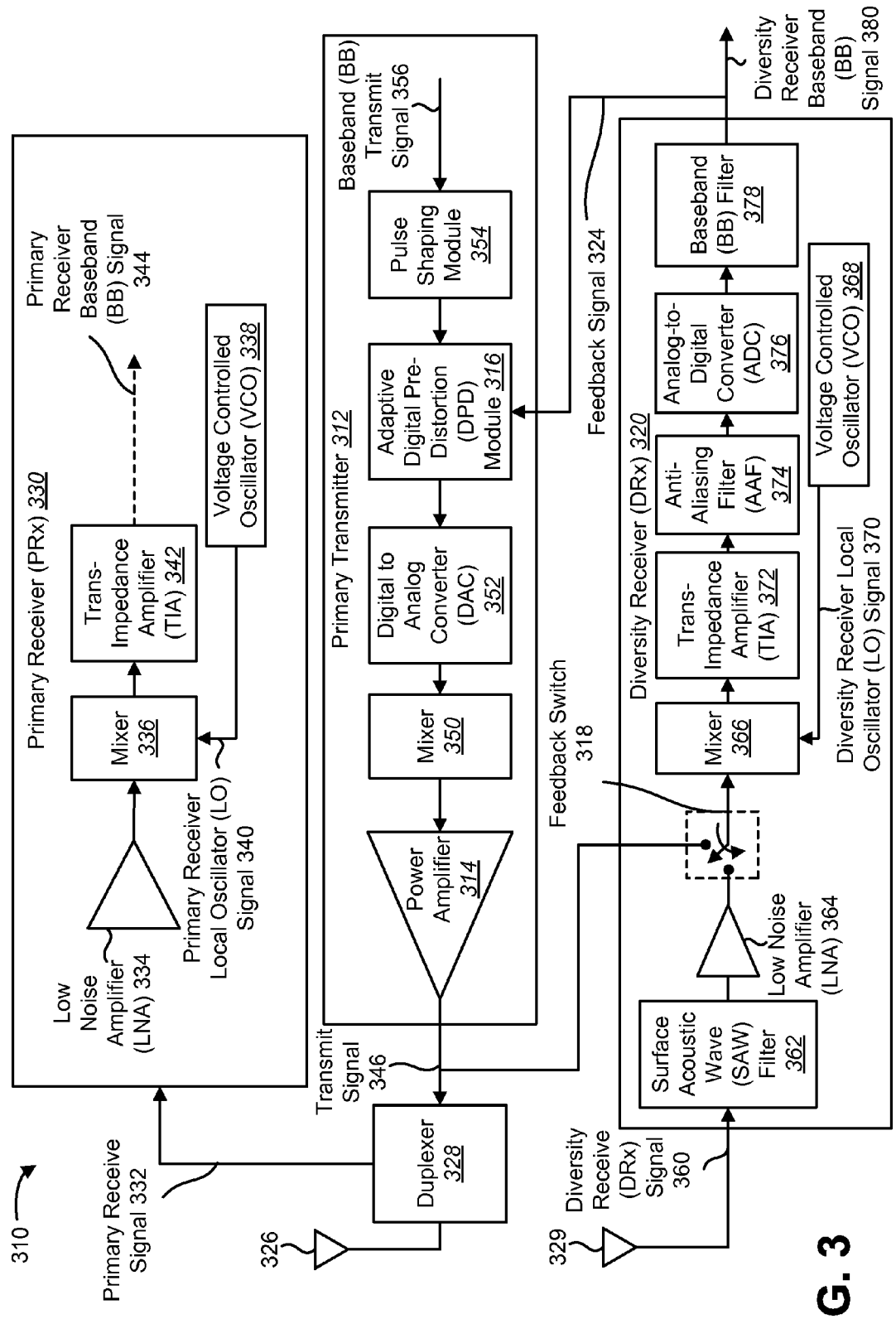
FIG. 3 is a block diagram illustrating another modem for use in the present systems and methods.

FIG. 3 is a block diagram illustrating another modem 310 for use in the present systems and methods. The modem 310 of FIG. 3 may be one configuration of the modem 110 of FIG. 1. The modem 310 may include a primary receiver (PRx) 330, a primary transmitter 312 and a diversity receiver (DRx) 320. The modem 310 may be on a wireless device 104 with a first antenna 326 and a second antenna 329. The first antenna 326 may be referred to as the primary antenna and the second antenna 329 may be referred to as the diversity antenna.

The first antenna 326 may be coupled to a duplexer 328. The duplexer 328 may allow the first antenna 326 to both transmit and receive. The duplexer 328 may forward primary receive signals 332 to the primary receiver 330 and receive transmit signals 346 from the primary transmitter 312. The primary receiver 330 may include a low noise amplifier (LNA) 334, a mixer 336 that receives a primary receiver local oscillator (LO) signal 340 from a voltage controlled oscillator (VCO) 338, a trans-impedance amplifier (TIA) 342 coupled to the mixer 336 and other circuitry (not shown) to obtain a received primary baseband (BB) signal 344 from the primary receive signal 332.

The primary transmitter 312 may also be coupled to the duplexer 328. The primary transmitter 312 may include a power amplifier 314. As discussed above, the power amplifier 314 may be a class A/B, B, C or other class amplifier. The output of the power amplifier 314 may be referred to as the transmit signal 346. The input of the power amplifier 314 may be coupled to a mixer 350. The mixer 350 may mix signals to a transmit frequency. The mixer 350 may be coupled to a digital-to-analog converter (DAC) 352. The digital-to-analog converter (DAC) 352 may be coupled to an adaptive digital pre-distortion (DPD) module 316. The adaptive digital pre-distortion (DPD) module 316 of FIG. 3 may be one configuration of the adaptive digital pre-distortion (DPD) module 116 of FIG. 1.

The adaptive digital pre-distortion (DPD) module 316 may be configured to perform amplitude-to-amplitude modulation (AMAM) compensation and amplitude-to-phase modulation (AMPM) compensation on an input signal. The adaptive digital pre-distortion (DPD) module 316 may add digital pre-distortion (DPD) to the input signal by performing amplitude-to-amplitude modulation (AMAM) compensation and amplitude-to-phase modulation (AMPM) compensation. The amplitude-to-amplitude modulation (AMAM) compensation and the amplitude-to-phase modulation (AMPM) compensation may be approximately opposite from the amplitude and phase distortion that results from the power amplifier 314, such that when a signal is amplified by the power amplifier 314, the amplified signal (i.e., the transmit signal 346) is a desired target signal rather than an undesired distorted signal. The pre-distortion of the input signal may permit the power amplifier 314 to be more efficient and to operate more closely to the saturation region.

The digital pre-distortion (DPD) applied by the adaptive digital pre-distortion (DPD) module 316 to an input signal may be adjusted according to a feedback signal 324 received from the diversity receiver (DRx) 320. The adaptive digital pre-distortion (DPD) module 316 may be coupled to a pulse shaping module 354. The pulse shaping module 354 may receive a transmit baseband (BB) signal 356.

The diversity receiver (DRx) 320 may receive a diversity receive signal 360 from the second antenna 329. The diversity receive signal 360 may be passed through a surface acoustic wave (SAW) filter 362 and a low noise amplifier (LNA) 364. The amplified signal may then be passed through a feedback switch 318 to a mixer 366 to adjust the frequency of the diversity receive signal 360 to the diversity receiver (DRx) frequency. The mixer 366 may receive a diversity receive local oscillator (LO) signal 370 (i.e., a signal with the receiving frequency of the diversity receiver (DRx) 320) from a voltage controlled oscillator (VCO) 368. The signal may then be passed through a trans-impedance amplifier (TIA) 372, an anti-aliasing filter (AAF) 374, an analog-to-digital converter (ADC) 376 and a baseband (BB) filter 378 to obtain a diversity receiver baseband (BB) signal 380. The diversity receiver baseband (BB) signal 380 may be provided to the primary transmitter 312 as the feedback signal 324 to adjust the digital pre-distortion (DPD) applied by the adaptive digital pre-distortion (DPD) module 316 when the diversity receiver (DRx) 320 is operating as a shared receiver 120.

The transmit signal 346 of the primary transmitter 312 may be coupled to the mixer 350 of the diversity receiver (DRx) 320 via the feedback switch 318. Because the transmit signal 346 has been amplified by the power amplifier 314, the low noise amplifier (LNA) 364 is not needed to amplify the transmit signal 346. Instead, the feedback switch 318 may be designed to attenuate the transmit signal 346 prior to the mixer 366 in the diversity receiver (DRx) 320 (i.e., the feedback switch 118 may include an attenuation coupling 221).

In one configuration, the voltage controlled oscillator (VCO) 368 on the diversity receiver (DRx) 320 may be adjusted to tune the diversity receiver local oscillator (LO) signal 370 to a frequency used by the primary transmitter 312. Thus, the voltage controlled oscillator (VCO) 368 may be tuned from a frequency of DRx_LO to a frequency of Tx_LO. The voltage controlled oscillator (VCO) 368 may also be adjusted to tune the diversity receiver local oscillator (LO) signal 370 to a frequency that can be used by both the primary transmitter 312 and the diversity receiver (DRx) 320. After providing the feedback signal 324 to the primary transmitter 312, the voltage controlled oscillator (VCO) 368 may be tuned back to the diversity receive local oscillator (LO) frequency.

The feedback switch 318 may only be turned on during times when having the feedback switch 318 on will minimally impact the downlink throughput. For example, the feedback switch 318 may only be turned on (coupling the transmit signal 346 to the mixer 366 of the diversity receiver (DRx) 320) when the diversity receiver (DRx) 320 is not receiving diversity receive signals 360. As another example, the feedback switch 318 may only be on when the diversity receiver (DRx) 320 is idle. In one configuration, the feedback switch 318 may always be on and the diversity receiver (DRx) 320 may be configured to receive diversity receive signals 360 while simultaneously receiving the transmit signal 346 from the primary transmitter 312.

The components of the modem 210 of FIG. 3 may all be located on the same integrated circuit. In one configuration, the primary receiver (PRx) 330, primary transmitter 312 and diversity receiver (DRx) 320 may be located on one or more transceiver chips while the adaptive digital pre-distortion (DPD) module 316, the pulse shaping module 354 and the baseband (BB) transmit signal 356 are located on a modem chip. Control signals from a processor on a modem chip may be provided to circuitry on the transceiver chips.

Figure 4:
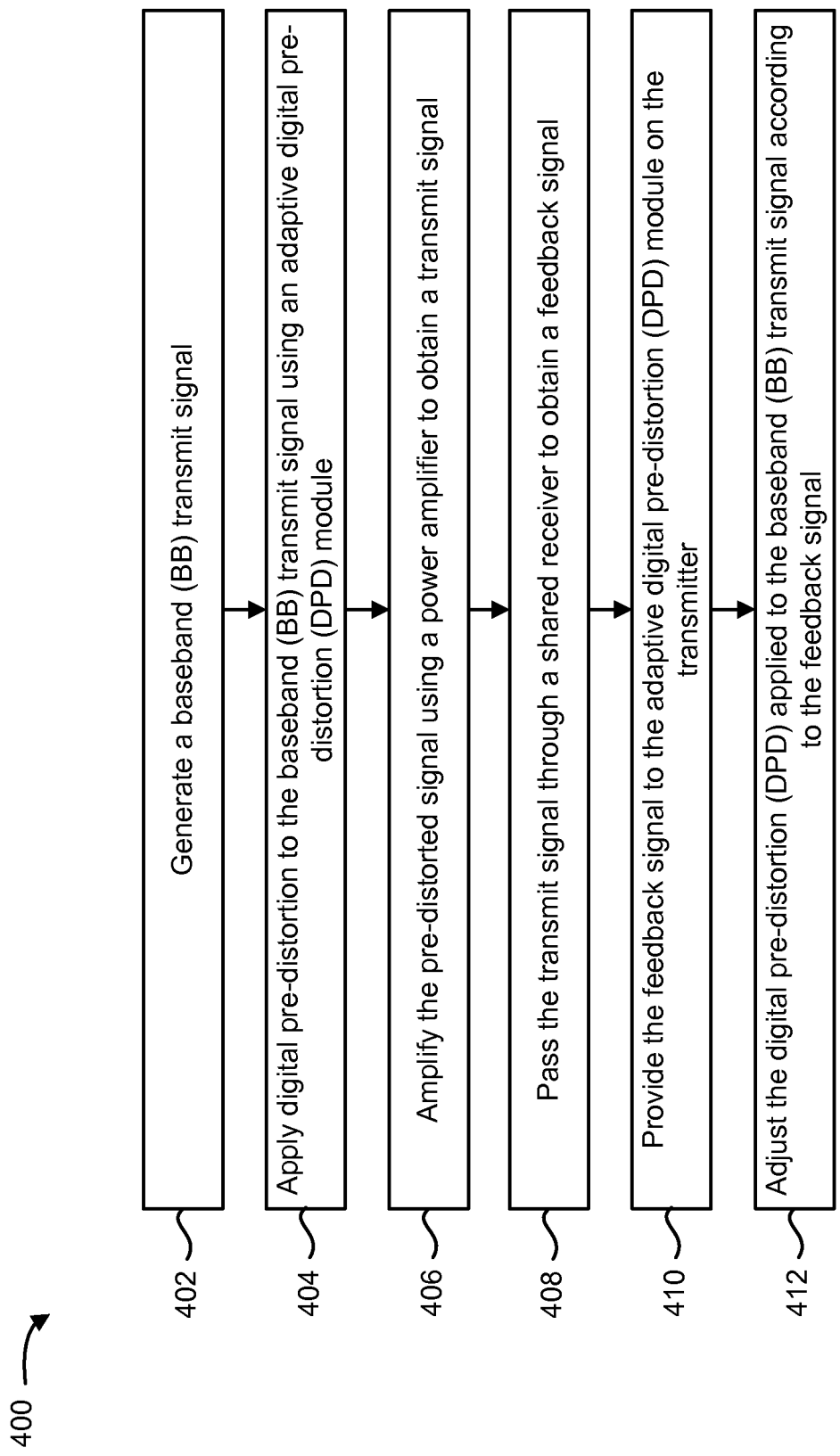
FIG. 4 is a flow diagram of a method for providing adaptive digital pre-distortion (DPD) to a transmit signal.

FIG. 4 is a flow diagram of a method 300 for providing adaptive digital pre-distortion (DPD) to a transmit signal 246. The method 400 may be performed by a wireless device 104. The wireless device 104 may generate 402 a baseband (BB) transmit signal 256. The wireless device 104 may then apply 404 digital pre-distortion (DPD) to the baseband (BB) transmit signal 256. The digital pre-distortion (DPD) may be applied to the baseband (BB) transmit signal 256 using an adaptive digital pre-distortion (DPD) module 216.

The wireless device 104 may amplify 406 the digital pre-distorted signal using a power amplifier 214 to obtain a transmit signal 246. The wireless device 104 may then pass 408 the transmit signal 246 through a shared receiver 220 to obtain a feedback signal 224. The wireless device 104 may provide 410 the feedback signal 224 to the adaptive digital pre-distortion (DPD) module 216 on the transmitter 212. The wireless device 104 may then adjust 412 the digital pre-distortion (DPD) applied to the baseband (BB) transmit signal 256 according to the feedback signal 224. Thus, the digital pre-distortion (DPD) applied to the baseband (BB) transmit signal 256 is adjustable.

Figure 5:
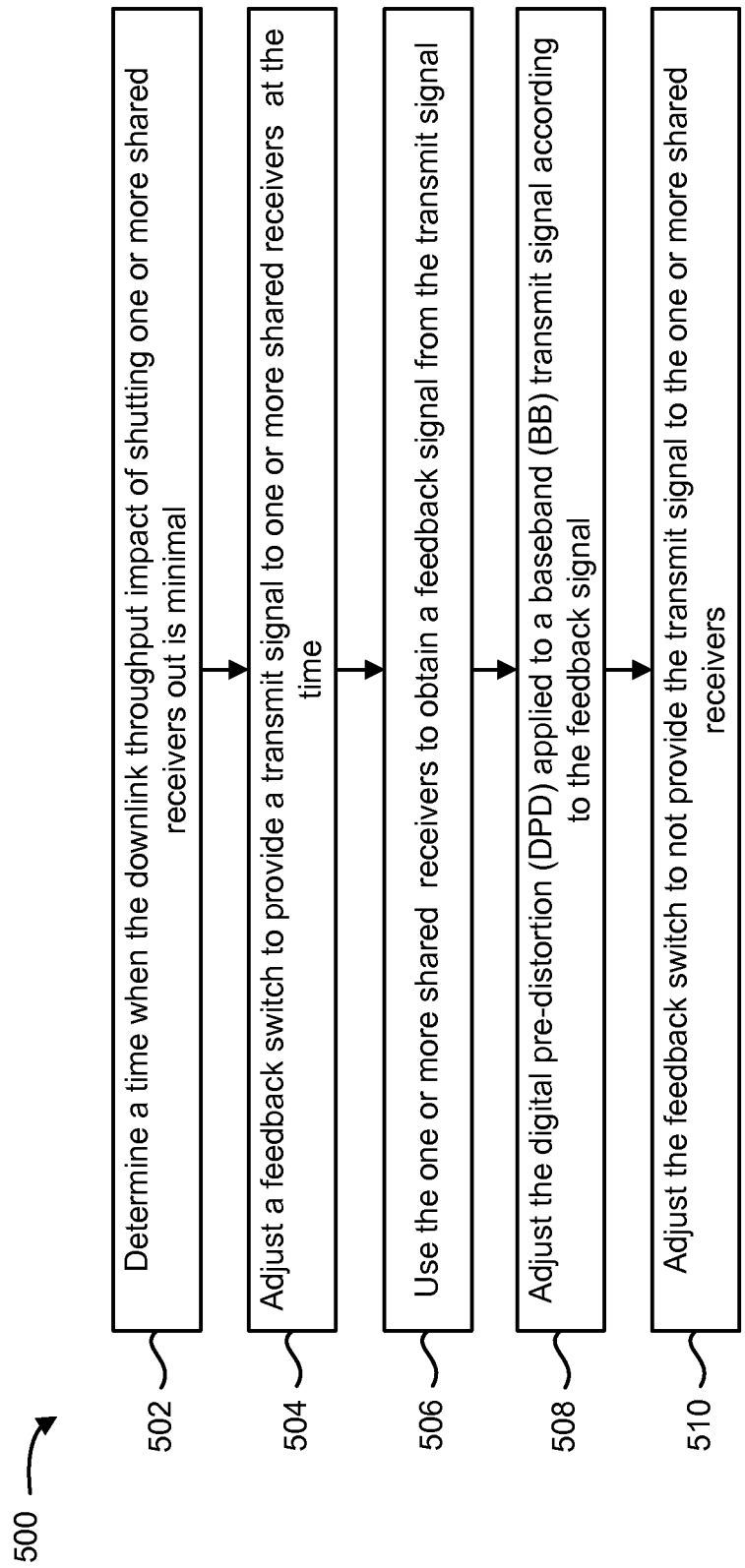
FIG. 5 is a flow diagram of a method for adjusting the digital pre-distortion (DPD) applied to a baseband (BB) transmit signal.

FIG. 5 is a flow diagram of a method 500 for adjusting the digital pre-distortion (DPD) applied to a baseband (BB) transmit signal 256. The method 500 may be performed by a wireless device 104. The wireless device 104 may determine 502 a time when the downlink throughput impact of switching the shared receiver 220 out is minimal. In other words, the wireless device 104 may determine the optimal time to use the shared receiver 220 for feedback. In one configuration, the downlink throughput impact of switching the shared receiver 220 out may be zero. The time may be a time slot, a time window, a starting time, etc. In one configuration, the shared receiver 220 may be used to sample the transmit signal 246 every ~10 seconds. For LTE, unused resource blocks (RBs) may be used to sample the transmit signal 246 by using the shared receiver 220 for feedback. For UMTS, 9000 samples x 32 nanoseconds (ns) (approximately) is every 288 microseconds (μs). For 1x, $$9000 \text{ samples} \times \frac{1}{1.23e^6} \times \frac{1}{16}$$

is every 457 μs.

The wireless device 104 may adjust 504 a feedback switch 218 to provide a transmit signal 246 to a shared receiver 220 at the determined time. In one configuration, the wireless device 104 may provide the transmit signal 246 to a mixer 366 in a diversity receiver (DRx) 320 being used as the shared receiver 220. The wireless device 104 may then use 506 the shared receiver 220 to obtain a feedback signal 224. The feedback signal 224 may be a receiver baseband (BB) signal 280 output by the shared receiver 220. The wireless device 104 may adjust 508 the digital pre-distortion (DPD) applied to a baseband (BB) transmit signal 256 according to the feedback signal 224. For example, the wireless device 104 may increase/decrease the magnitude of the digital pre-distortion (DPD) and/or adjust the phase of the digital pre-distortion (DPD) according to the feedback signal 224. The wireless device 104 may then adjust 510 the feedback switch 218 to not provide the transmit signal 246 to the shared receiver 220. This allows the shared receiver 220 to operate as a normal receiver (i.e., to receive radio frequency (RF) receive signals 137).

Figure 6:
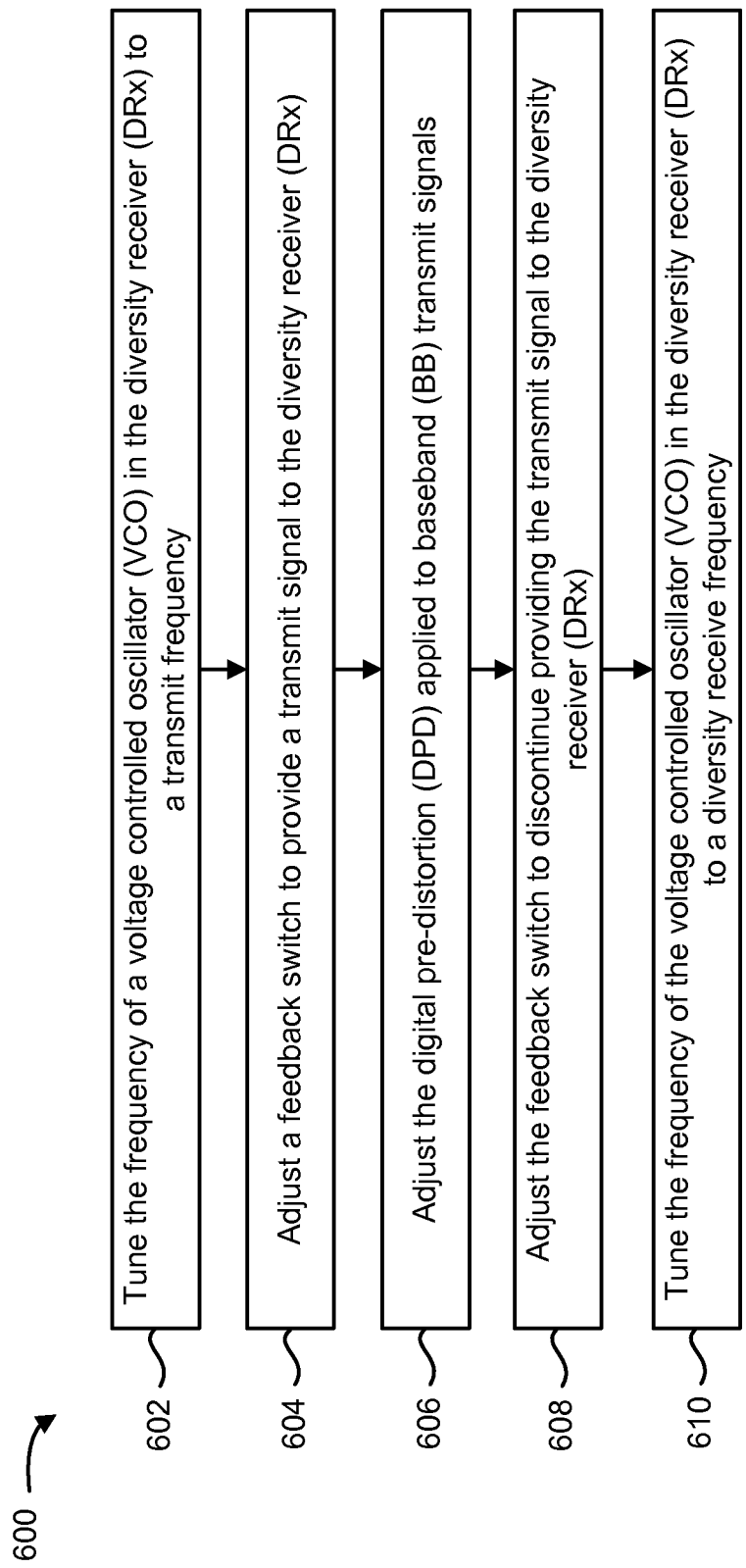
FIG. 6 is a flow diagram of another method for providing adaptive digital pre-distortion (DPD) to a transmit signal.

FIG. 6 is a flow diagram of another method 600 for providing adaptive digital pre-distortion (DPD) to a transmit signal 346. The method 600 may be performed by a wireless device 104. The wireless device 104 may tune 602 the frequency of a voltage controlled oscillator (VCO) 368 in a diversity receiver (DRx) 320 used as a shared receiver 220 to a transmit frequency Tx_LO. The transmit frequency Tx_LO may be a frequency used by a mixer 350 in a primary transmitter 312 prior to amplifying the signal using a power amplifier 314. In one configuration, the transmit frequency Tx_LO may be a frequency used by both the primary transmitter 312 and the diversity receiver (DRx) 320.

The wireless device 104 may adjust 604 a feedback switch 318 to provide the transmit signal 346 to the diversity receiver (DRx) 320. The wireless device 104 may then adjust 606 the digital pre-distortion (DPD) applied to baseband (BB) transmit signals 356. The wireless device 104 may adjust 608 the feedback switch 318 to discontinue providing the transmit signal 346 to the diversity receiver (DRx) 320. The wireless device 104 may then tune 610 the frequency of the voltage controlled oscillator (VCO) 368 in the diversity receiver (DRx) 320 back to a diversity receive frequency DRx_LO.

Figure 7:
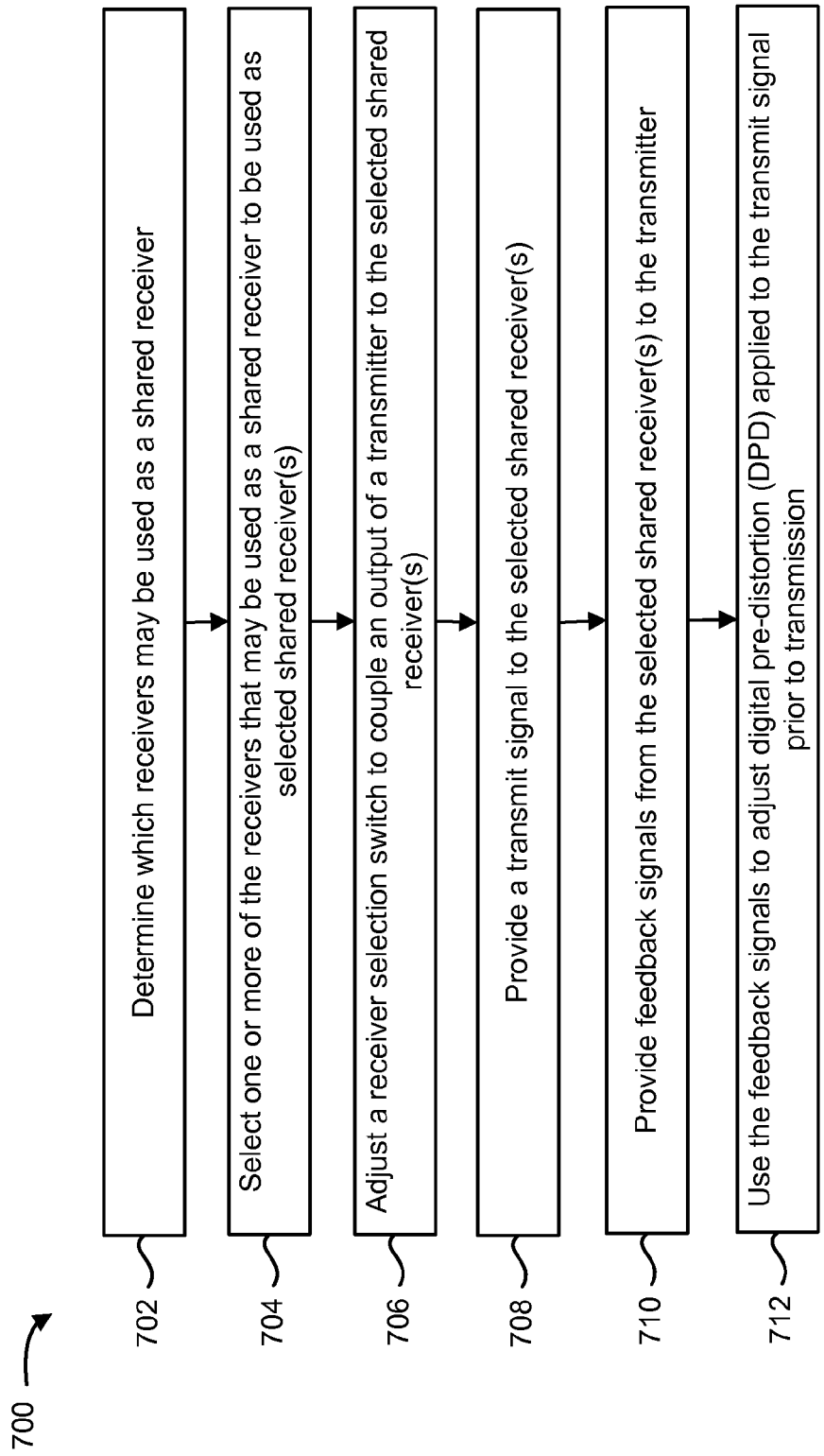
FIG. 7 is a flow diagram of a method for selecting one or more receivers to be used as shared receivers.

FIG. 7 is a flow diagram of a method 700 for selecting one or more receivers to be used as shared receivers 220. The method 700 may be performed by a modem 110 on a wireless device 104. The wireless device 104 may be an access terminal, a mobile station, a user equipment (UE), a wireless communication device, a femtocell, a picocell, a repeater, a relay, etc. The modem 110 may include a transmitter 112 and one or more receivers that may be used as shared receivers 120. The modem 110 may determine 702 which receivers may be used as a shared receiver 120. The modem 110 may then select 704 one or more of the receivers that may be used as a shared receiver to be the shared receiver(s) 120. Thus, the modem 110 may select 704 a subset of shared receivers 120 from the set of potential shared receivers 120. The selected shared receivers 120 may be those shared receivers 120 that will provide an optimal feedback signal 124 to the transmitter 112 for adaptive digital pre-distortion (DPD).

The modem 110 may adjust 706 a receiver selection switch 123 to couple an output of the transmitter 112 with the selected shared receivers 120. The modem 110 may then provide 708 a transmit signal 122 to the selected shared receivers 120. The modem 110 may also provide 710 feedback signals 124 from the selected shared receivers 120 to the transmitter 112. The modem 110 may use 712 the feedback signals 124 to adjust digital pre-distortion (DPD) applied to the transmit signal 122 prior to transmission.

Figure 8:
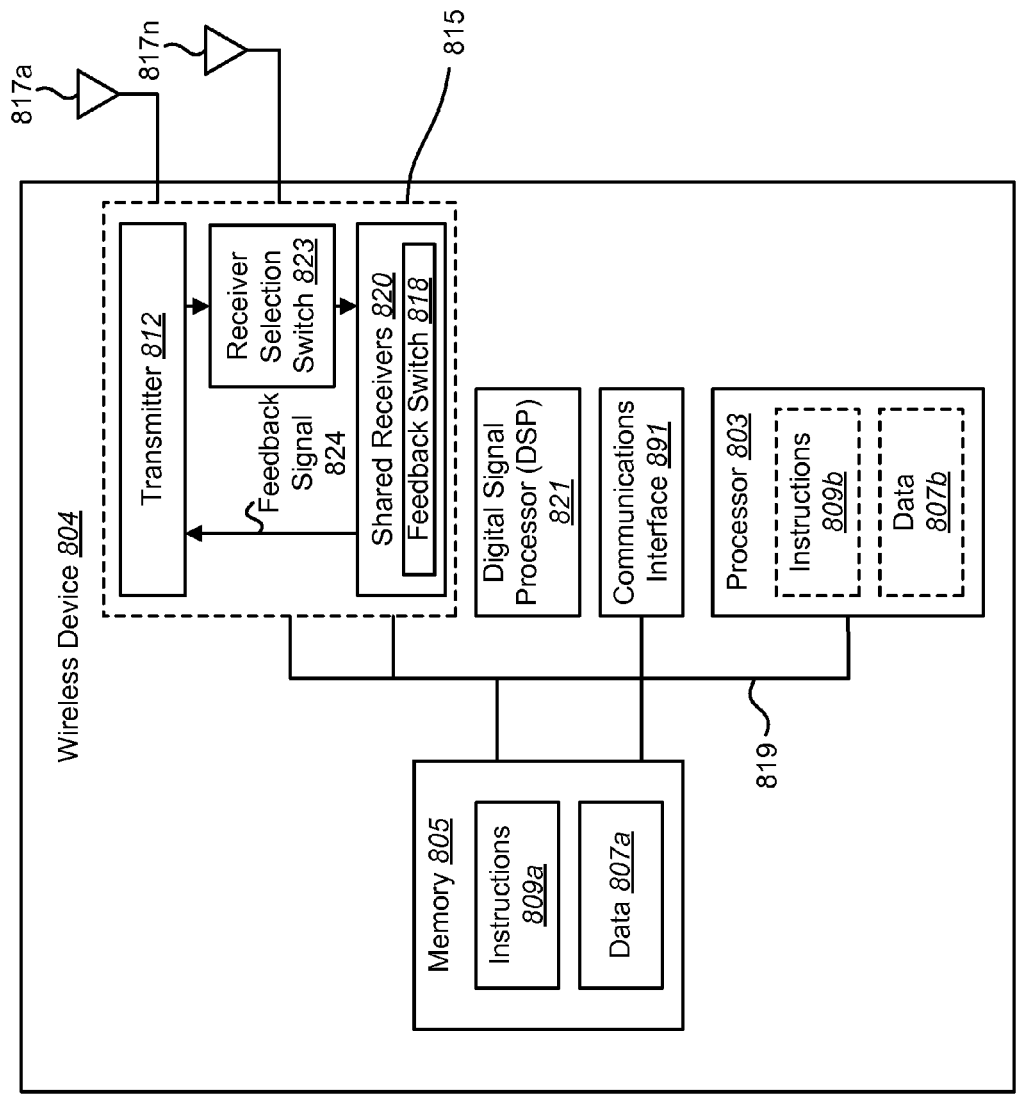
FIG. 8 illustrates certain components that may be included within a wireless device.

FIG. 8 illustrates certain components that may be included within a wireless device 804. The wireless device 804 may be an access terminal, a mobile station, a user equipment (UE), a wireless communication device, a femtocell, a picocell, a repeater, a relay, etc. The wireless device 804 includes a processor 803. The processor 803 may be a general purpose single- or multi-chip microprocessor (e.g., an ARM), a special purpose microprocessor (e.g., a digital signal processor (DSP)), a microcontroller, a programmable gate array, etc. The processor 803 may be referred to as a central processing unit (CPU). Although just a single processor 803 is shown in the wireless device 804 of FIG. 8, in an alternative configuration, a combination of processors (e.g., an ARM and DSP) could be used.

The wireless device 804 also includes memory 805. The memory 805 may be any electronic component capable of storing electronic information. The memory 805 may be embodied as random access memory (RAM), read-only memory (ROM), magnetic disk storage media, optical storage media, flash memory devices in RAM, on-board memory included with the processor, EPROM memory, EEPROM memory, registers and so forth, including combinations thereof Data 807*a* and instructions 809*a* may be stored in the memory 805. The instructions 809*a* may be executable by the processor 803 to implement the methods disclosed herein. Executing the instructions 809*a* may involve the use of the data 807*a* that is stored in the memory 805. When the processor 803 executes the instructions 809, various portions of the instructions 809*b* may be loaded onto the processor 803, and various pieces of data 807*b* may be loaded onto the processor 803.

The wireless device 804 may also include a transmitter 812 and one or more shared receivers 820 to allow transmission and reception of signals to and from the wireless device 804 via multiple antennas 817*a-n*. The transmitter 812 may receive a feedback signal 824 from the one or more shared receivers 820. The transmitter 812 may select which receivers are used as shared receivers 820 using a receiver selection switch 823. The receiver selection switch 823 may provide a transmit signal generated by the transmitter 812 to only those receivers selected as shared receivers 820. Each shared receiver 820 may include a feedback switch 818. The feedback switch 818 may allow a shared receiver 820 to switch between receiving signals from an antenna 817 and receiving signals from the transmitter 812 used for feedback. The receiver selection switch 823 and the feedback switch 818 may be separate switches or combined into a single switch. The transmitter 812 and shared receivers 820 may be collectively referred to as a transceiver 815. The wireless device 804 may also include (not shown) multiple transmitters, additional antennas, additional receivers not used as shared receivers 820 and/or multiple transceivers.

The wireless device 804 may include a digital signal processor (DSP) 821. The wireless device 804 may also include a communications interface 823. The communications interface 891 may allow a user to interact with the wireless device 804.

The various components of the wireless device 804 may be coupled together by one or more buses, which may include a power bus, a control signal bus, a status signal bus, a data bus, etc. For the sake of clarity, the various buses are illustrated in FIG. 8 as a bus system 819.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

The functions described herein may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer or processor. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio and microwave, then the coaxial cable, fiber optic cable, twisted pair, DSL, or wireless technologies such as infrared, radio and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 3, 4 and 5, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods and apparatus described herein without departing from the scope of the claims.

What is claimed is:

1. A modem, comprising:
   a transmitter comprising:
      a digital pre-distortion module; and
      a power amplifier;
   one or more selected shared receivers, wherein the shared receivers are configured to receive signals via one or more antennas and generate a feedback signal for the digital pre-distortion module; and
   a feedback switch configured to selectively couple the one or more selected shared receivers to an output of the transmitter, wherein the one or more selected shared receivers comprise a voltage controlled oscillator tuned to a receiving frequency of the one or more selected shared receivers when the feedback switch is open and tuned to a transmit frequency of the transmitter when the feedback switch is closed.

2. The modem of claim 1, wherein the feedback switch is coupled to an output of the power amplifier.

3. The modem of claim 1, wherein the feedback switch selectively couples the output of the transmitter to an input of a mixer in the one or more selected shared receivers.

4. The modem of claim 1, further comprising an attenuation coupling between an output of the power amplifier and the feedback switch.

5. The modem of claim 1, wherein the feedback signal is a receiver baseband signal output by the one or more selected shared receivers.

6. The modem of claim 1, wherein the voltage controlled oscillator is tuned to a frequency used by both the one or more selected shared receivers and the transmitter.

7. The modem of claim 1, wherein the feedback switch is closed during a time when a downlink throughput of shutting the one or more selected shared receivers out is minimal.

8. The modem of claim 1, wherein the digital pre-distortion module adds digital pre-distortion to a transmit signal.

9. The modem of claim 8, wherein the digital pre-distortion is adjusted according to a feedback signal received from the one or more selected shared receivers when the feedback switch is closed.

10. The modem of claim 8, further comprising:
    a receiver selection switch; and
    multiple receivers, wherein the receiver selection switch selects a subset of the multiple receivers as the one or more selected shared receivers.

11. The modem of claim 10, wherein the subset of the multiple receivers comprises the receivers that provide the best feedback signal to the transmitter.

12. The modem of claim 1, wherein the modem is part of a wireless communication device.

13. The modem of claim 1, wherein the modem is part of a picocell.

14. The modem of claim 1, wherein the modem is part of a femtocell.

15. The modem of claim 1, wherein the one or more selected shared receivers comprises a diversity receiver.

16. A method for applying digital pre-distortion in a transmitter, the method comprising:
    applying digital pre-distortion to a baseband transmit signal to obtain a pre-distorted signal;
    amplifying the pre-distorted signal using a power amplifier to obtain a transmit signal;
    selecting one or more shared receivers from a subset of receivers as selected shared receivers;
    adjusting a receiver selection switch to provide the transmit signal to the one or more selected shared receivers
    passing the transmit signal through the one or more selected shared receivers to obtain a feedback signal, wherein the one or more selected shared receivers are configured for receiving signals via one or more antennas and generating the feedback signal; and
    adjusting the digital pre-distortion applied to the baseband transmit signal according to the feedback signal.

17. The method of claim 16, wherein the digital pre-distortion is applied using an adaptive digital pre-distortion module, and wherein the feedback signal is provided to the adaptive digital pre-distortion module.

18. The method of claim 16, wherein the feedback signal is an output of a baseband filter on the one or more selected shared receivers.

19. The method of claim 16, wherein the transmit signal is input to a mixer in the one or more selected shared receivers.

20. The method of claim 19, further comprising:
adjusting a feedback switch to provide the transmit signal to the mixer in the one or more selected shared receivers; and
adjusting the feedback switch to discontinue providing the transmit signal to the mixer in the one or more selected shared receivers.

21. The method of claim 20, wherein the digital pre-distortion applied to the baseband transmit signal is only adjusted when the feedback switch is closed and providing the transmit signal to the mixer in the one or more selected shared receivers.

22. The method of claim 20, further comprising:
tuning a frequency of a voltage controlled oscillator in the one or more selected shared receivers to a transmit frequency prior to adjusting the digital pre-distortion applied to the baseband transmit signal; and
tuning the frequency of the voltage controlled oscillator in the one or more selected shared receivers to a diversity receive frequency after adjusting the digital pre-distortion applied to the baseband transmit signal.

23. The method of claim 16, wherein the method is performed by a modem.

24. The method of claim 23, wherein the modem comprises:
a transmitter comprising:
a digital pre-distortion module; and
a power amplifier;
one or more selected shared receivers that generate a feedback signal for the digital pre-distortion module; and
a feedback switch selectively coupling the one or more selected shared receivers to an output of the transmitter.

25. The method of claim 24, wherein the feedback switch is coupled to an output of the power amplifier.

26. The method of claim 24, wherein the feedback switch selectively couples the output of the transmitter to an input of a mixer in the one or more selected shared receivers.

27. The method of claim 24, wherein the modem further comprises an attenuation coupling between an output of the power amplifier and the feedback switch.

28. The method of claim 24, wherein the feedback signal is a receiver baseband signal output by the one or more selected shared receivers.

29. The method of claim 24, wherein the one or more selected shared receivers comprise a voltage controlled oscillator tuned to a receiving frequency of the one or more selected shared receivers when the feedback switch is open and tuned to a transmit frequency of the transmitter when the feedback switch is closed.

30. The method of claim 24, wherein the one or more selected shared receivers comprise a voltage controlled oscillator tuned to a frequency used by both the one or more selected shared receivers and the transmitter.

31. The method of claim 24, wherein the feedback switch is closed during a time when a downlink throughput of shutting the one or more selected shared receivers out is minimal.

32. The method of claim 24, wherein the digital pre-distortion module adds digital pre-distortion to a transmit signal.

33. The method of claim 32, wherein the digital pre-distortion is adjusted according to a feedback signal received from the one or more selected shared receivers when the feedback switch is closed.

34. The method of claim 32, wherein the modem further comprises:
a receiver selection switch; and
multiple receivers, wherein the receiver selection switch selects a subset of the multiple receivers as the one or more selected shared receivers.

35. The method of claim 34, wherein the subset of the multiple receivers comprises the receivers that provide the best feedback signal to the transmitter.

36. The method of claim 24, wherein the modem is part of a wireless communication device.

37. The method of claim 24, wherein the modem is part of a picocell.

38. The method of claim 24, wherein the modem is part of a femtocell.

39. The method of claim 24, wherein the one or more selected shared receivers comprises a diversity receiver.

40. An apparatus comprising:
means for applying digital pre-distortion to a baseband transmit signal to obtain a pre-distorted signal;
means for amplifying the pre-distorted signal using a power amplifier to obtain a transmit signal;
means for passing the transmit signal through one or more shared receivers to obtain a feedback signal, wherein the one or more shared receivers are configured for receiving signals via one or more antennas and generating the feedback signal;
means for adjusting the digital pre-distortion applied to the baseband transmit signal according to the feedback signal;
means for adjusting a feedback switch to provide the transmit signal to the mixer in the one or more shared receivers; and
means for adjusting the feedback switch to discontinue providing the transmit signal to the mixer in the one or more shared receivers.

41. The apparatus of claim 40, further comprising:
means for tuning a frequency of a voltage controlled oscillator in the one or more shared receivers to a transmit frequency prior to adjusting the digital pre-distortion applied to the baseband transmit signal; and
means for tuning the frequency of the voltage controlled oscillator in the one or more shared receivers to a diversity receive frequency after adjusting the digital pre-distortion applied to the baseband transmit signal.

42. A computer-program product for adjusting digital pre-distortion, the computer-program product comprising a non-transitory computer-readable medium having instructions thereon, the instructions comprising:
code for causing a wireless device to apply digital pre-distortion to a baseband transmit signal to obtain a pre-distorted signal;
code for causing the wireless device amplify the pre-distorted signal using a power amplifier to obtain a transmit signal;
code for causing the wireless device to pass the transmit signal through one or more shared receivers to obtain a feedback signal, wherein the one or more shared receivers are configured for receiving signals via one or more antennas and generating the feedback signal;
code for causing the wireless device to adjust the digital pre-distortion applied to the baseband transmit signal according to the feedback signal;
code for causing the wireless device to adjust a feedback switch to provide the transmit signal to the mixer in the one or more shared receivers; and
code for causing the wireless device to adjust the feedback switch to discontinue providing the transmit signal to the mixer in the one or more shared receivers.

43. The computer-program product of claim 42, the instructions further comprising:
- code for causing the wireless device to tune a frequency of a voltage controlled oscillator in the one or more shared receivers to a transmit frequency prior to adjusting the digital pre-distortion applied to the baseband transmit signal; and
- code for causing the wireless device to tune the frequency of the voltage controlled oscillator in the one or more shared receivers to a diversity receive frequency after adjusting the digital pre-distortion applied to the baseband transmit signal.

* * * * *